United States Patent [19]

Guzinski et al.

[11] Patent Number: 5,473,651
[45] Date of Patent: Dec. 5, 1995

[54] METHOD AND APPARATUS FOR TESTING LARGE EMBEDDED COUNTERS

[75] Inventors: Miroslaw Guzinski, Lawrenceville; Ilyoung Kim, Plainsboro, both of N.J.

[73] Assignee: AT&T Corp., Murray Hill, N.J.

[21] Appl. No.: 365,264

[22] Filed: Dec. 28, 1994

[51] Int. Cl.⁶ ................................................. H03K 21/40
[52] U.S. Cl. ........................................... 377/29; 377/54
[58] Field of Search ................................. 377/28, 29, 54

[56] References Cited

U.S. PATENT DOCUMENTS

| | | | |
|---|---|---|---|
| 3,613,014 | 10/1971 | Moegen | 377/29 |
| 4,336,448 | 6/1982 | Shipp et al. | 377/29 |
| 4,519,090 | 5/1985 | Stackhouse et al. | 377/29 |
| 4,860,325 | 8/1989 | Aria et al. | 377/29 |
| 5,381,453 | 1/1995 | Chan | 377/28 |

*Primary Examiner*—John S. Heyman

[57] ABSTRACT

An N stage counter includes peripheral circuitry for testing the operability of the counter. The peripheral circuitry includes gating means coupled between certain stages of the counter for partitioning the counter into at least first and second counter sections during a testing mode. During the testing mode, the N counter stages are reset to an all zero condition and this resettability capability is detected. During the testing mode, the N counter stages are also set to a predetermined value and the settability of the counter stage to a non-zero condition is also detected. During one phase of the testing mode, the first section counts a predetermined number of clock cycles while all counts produced at the outputs of all the stages of the second section are totalled in a register means. During another phase of the testing mode, the second section counts a predetermined number of clock cycles while all the counts produced at the outputs of all the stages in the first section are totalled in the register means. Thus, during the one phase, the first section functions as a timer for the second section and during the second phase, the second section functions as a timer for the first section. The counts generated by the first and second sections are subsequently totalled and compared with a predetermined number to ascertain the operability of the counter.

23 Claims, 13 Drawing Sheets

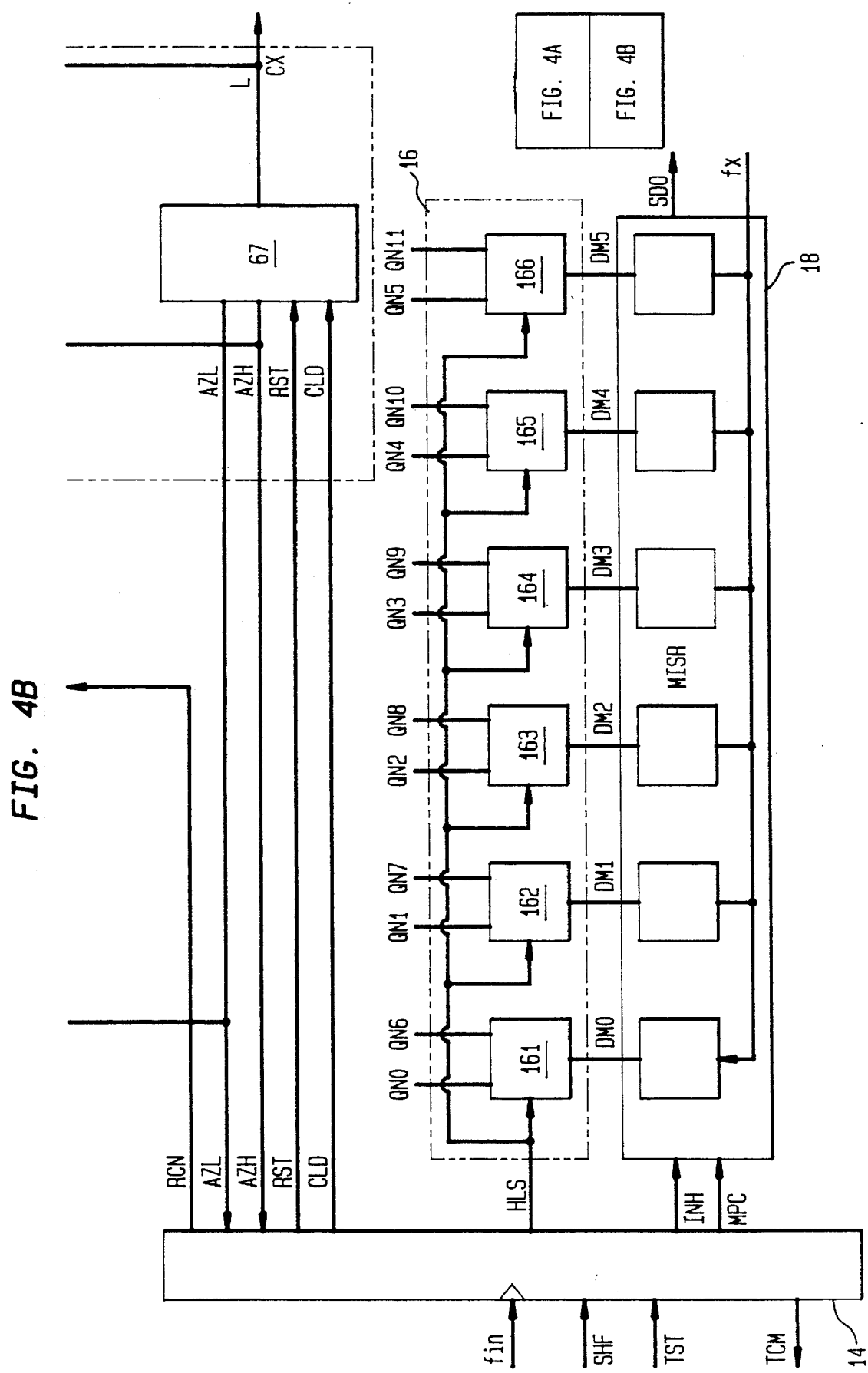

| STATE | OUTPUTS | | | | | | |
|---|---|---|---|---|---|---|---|
| | TCM | CLD | RST | RCN | HLS | INH | MPC |
| RES=000 | 0 | 0 | 0 | 0 | 0 | 1 | 1 |
| RCM=001 | 0 | 1 | 1 | 1 | 1 | 1 | 1 |
| LAD=011 | 0 | 1 | 0 | 1 | 1 | 0 | 1 |
| CTL=010 | 0 | 0 | 0 | 1 | 1 | 1 | 0 |
| CTH=110 | 0 | 0 | 0 | 1 | 0 | 1 | 0 |
| SFT=100 | 1 | 1 | 1 | 1 | 0 | 0 | 0 |
| LST=101 | 1 | 1 | 1 | 1 | 0 | 1 | 0 |

METHOD AND APPARATUS FOR TESTING LARGE EMBEDDED COUNTERS

BACKGROUND OF THE INVENTION

This invention relates to means for testing a "long" counter, (i.e., one having many stages) where the inputs and outputs of each stage of the counter are not accessible.

By way of example, a large complex system including a digital frequency synthesizer formed on an integrated circuit (IC) may include one or more "long" counter circuits "embedded" on the same IC. The "long" counters are characterized as being "embedded" in that due to the complexity of the system and the limited number of pin connections that can be made to the IC, it is not desirable and/or possible to access the inputs and outputs of individual counter stages. For example, refer to FIG. 1 which shows a simplified block diagram of a typical phase locked loop digital frequency synthesizer suitable for use in a cordless or cellular telephone. The synthesizer includes an input terminal, 101, to which is applied a first input signal, fin. The signal fin is applied to an M-bit reference divider 102. In this example, M is equal to 12 and divider 102 is a 12 bit binary counter/divider. A reference output signal (fr) produced at the output of divider 102 is fed to an input of a phase comparator 103. Another input of comparator 103 is connected to the output (ff) of an N-bit programmable main divider/counter 104. In this example, N is 24 bits and counter 104 may be set to divide or count up to a maximum of 24 bits (i.e.,$2^{24}$). The outputs (u,d) of the phase comparator 103 are applied to the inputs of a charge pump 105 whose output is applied to the input of a low pass filter 106 whose output is fed to the input of a voltage controlled oscillator (VCO) 107 at whose output 108 is produced an output frequency signal fo which is applied to the input of divider 104. The output frequency fo is equal to fin[N/M], where the ratio of N and M may be varied to provide a desired fo. The dividers/counters in the system are critical to its proper operation and to meet requirements of the Federal Communication Commission (FCC). It is therefore necessary to test their operability. However, the frequency synthesizer is part of a complex system and when formed on an IC most of the pins of the IC are required to access more critical system functions. Consequently, a problem exists regarding the testing of the counters/dividers to determine their operability.

The task is rendered more difficult where it is also desirable and/or necessary to test the counters quickly with a minimum amount of additional circuitry. Thus, a problem exists where a long counter has to be tested and the inputs and outputs of the counter stages are not accessible.

A prior art scheme for testing a binary counter is disclosed in U.S. Pat. No. 4,336,448 titled Binary Counter and Circuit For Testing Same to Shipp et al. The '448 patent suggests the partitioning of a ripple counter and then operating the partitioned sections sequentially in order to speed up the time to test the operability of the counter. However, the disclosed scheme is defective in that it only tests whether each section can reach an overflow condition and whether the counter sections overflow. Thus, if a fault exists at some internal point of the sections, the fault will not be detected where an overflow condition is eventually produced. Consequently the prior art scheme does not have extensive fault coverage. Also, in the '448 patent, the tester must wait the full period required for an overflow to occur to ascertain whether there is an error in the counters. Still further in the '448 patent, the counters make use of ripple down binary counters which are prone to noise and which are not synchronous. Consequently, in these type of circuits delays accumulate from stage to stage rendering the scheme inappropriate for high frequency applications. Furthermore, in the '448 patent the clock signal is routed to different sections of the counter via routing logic having different delays. This gives rise to race conditions which limit the speed of operation of the system.

An object of the invention is to provide built-in test circuitry for simplifying and speeding-up the testing of "long" counters while providing extensive fault coverage.

SUMMARY OF THE INVENTION

In systems embodying the invention, a long counter having N stages includes means for testing the counter, with the testing means including means for partitioning the N stages of the counter into "X" separate sections during testing; where N is an integer greater than 4 and X is an integer equal to, or greater than, 2, and less than N. Means coupled to each one of the X sections apply clocking signals to each section, with each section being arranged to count a predetermined number of clock cycles. Each one of the X sections, including the outputs of all the stages of that section, is coupled, in turn via a multiplexing arrangement, to a register means for sensing and totalling the outputs and the counts of each section. This enables the testing of the long counter with extensive fault coverage and in a reasonable period of time.

In a preferred embodiment in which one counter is partitioned into two ( or more) sections, one section counts a preset number of clock cycles while the outputs from the other section are being summed or totalled in the register means. Then, the other section counts a given number of cycles while the outputs from the first section are summed or totalled. Thus, during each portion of a test cycle one section of the counter functions as a reference counter or timer for the other section.

In a preferred embodiment the register means is a multi-input shift register (MISR) configured to compact the data received from the various sections of the counters. Compaction is employed to reduce the number of data. Also, in a preferred embodiment, the compacted signal produced by each one of the X sections of the partitioned counter is used as the initial data (i.e., "seed") and is added to the data resulting from the next section. The compacted total data for all the sections of the counter are then evaluated to determine whether the counter is functioning correctly. This is ascertainable since the final (total) signature for the counter operating correctly is different than the final signature when the counter is defective.

In a preferred embodiment the testing circuitry includes a multiplexer coupled between the X sections and the MISR and a controller for determining the sequence in which the counter is tested and the order in which the X sections of the counter get coupled to the MISR.

In systems embodying the invention test logic circuitry associated with the counters is used to check whether the counters and the associated logic circuitry respond correctly to a first condition in which all the counter stages are reset to zero and then to a second condition when the counter stages are loaded to a number different than zero. Testing for the first and second conditions is a quick way of determining whether the counter and the associated logic circuitry operate correctly for two boundary conditions.

The invention also resides in a method of testing a counter including the steps of setting and resetting the counter to predetermined conditions and detecting the counter's response to these setting and resetting conditions to determine the counter's operability. The method of testing the counter also includes the step of partitioning the counter into sections and applying a clocking signal to one section for a predetermined number of clock cycles defining a first time interval, and applying the clocking signal to another section for summing the count produced by the second section during the first time interval.

BRIEF DESCRIPTION OF THE DRAWINGS

In the accompanying figures like reference characters denote like components.

DETAILED DESCRIPTION OF THE INVENTION

Figure 1:
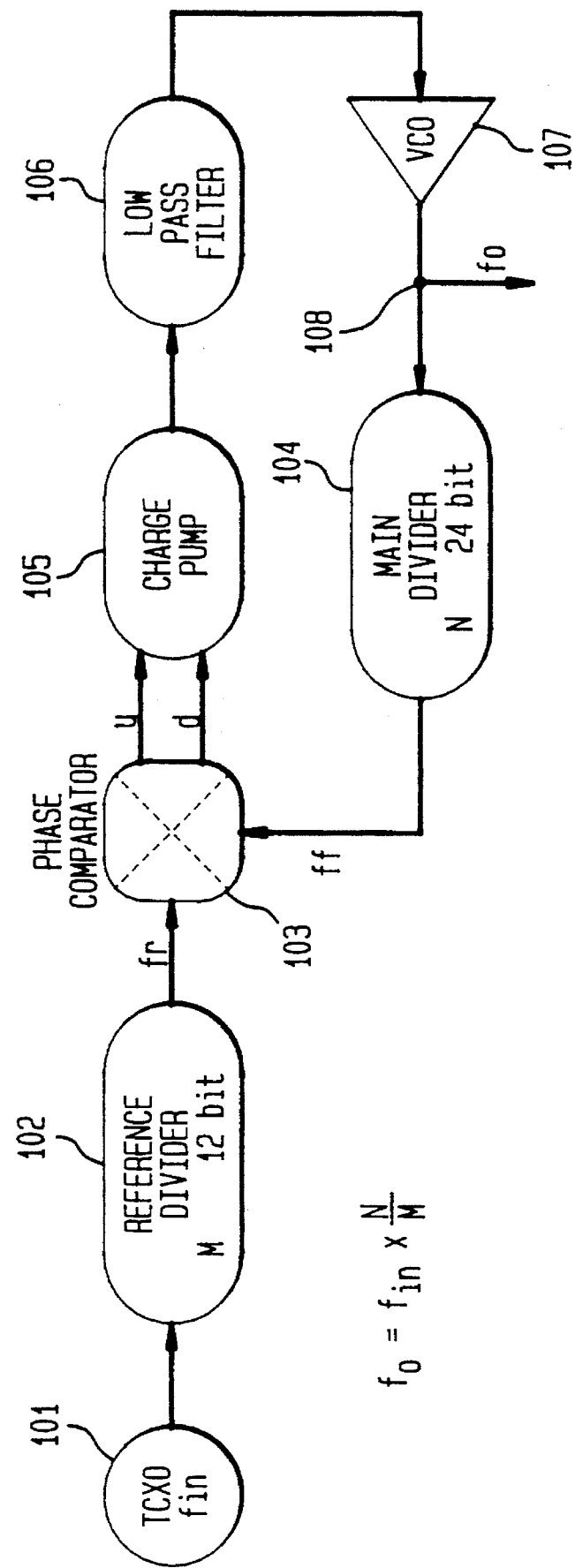
FIG. 1 is a block diagram of a prior art frequency synthesizer with two counters.
Figure 2:
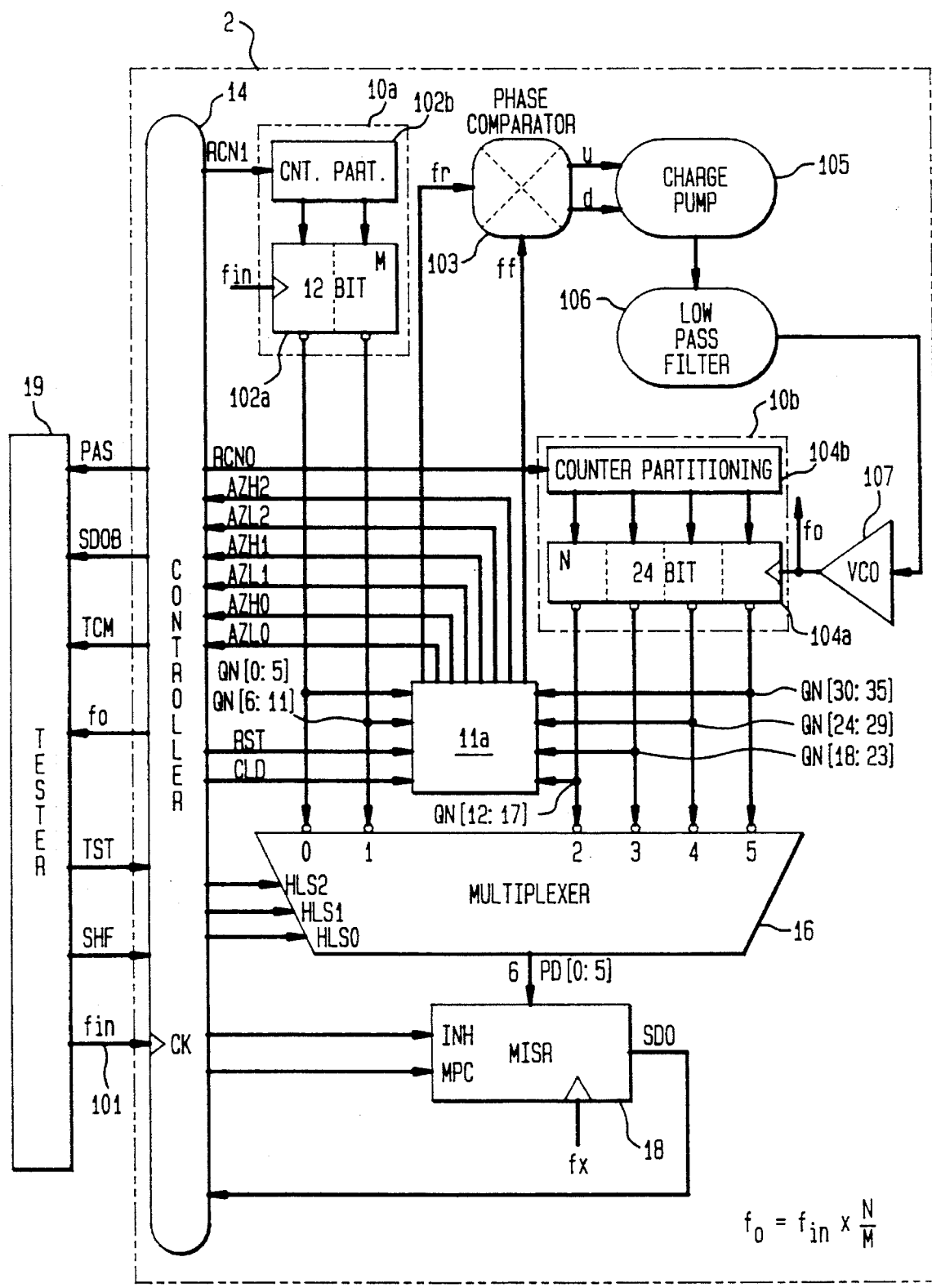
FIG. 2 is a block diagram of a frequency synthesizer with a counter system embodying the invention having improved testability.

In the description to follow, a method for testing a "long" counter and particular apparatus for testing the counter will be disclosed. FIG. 2 illustrates a frequency synthesizer system of the type shown in FIG. 1 modified in accordance with the invention to enable the testing of "long" counters used in the system. Typically, the frequency synthesizer system is formed on an integrated circuit (IC) shown contained within box 2 defined by the dotted lines in FIG. 2. Referring to FIG. 2, it is seen that counter 102 of FIG. 1 is replaced with a counter 10a which includes a synchronous binary counter 102a, operated as a down counter, and a counter partitioning circuit 102b and that counter 104 is replaced with a counter 10b which includes a synchronous binary counter 104a, operated as a down counter, and a counter partitioning circuit 104b. The output Fo of VCO 107 is shown connected directly to the input of counter 104a. However, in practice, an amplifier/buffer (not shown) may be connected between the output of VCO 107 and the input of counter 104a to fully digitize the signals applied to the counter.

The outputs of the stages comprising counters 102a and 104a are coupled to a logic section 11a and to a multiplexer (MUX) circuit 16. The outputs of the MUX 16 are coupled to a multi-input signature register (MISR) 18. The MISR 18 may be of the type shown and discussed at pages 124–128 of the Wiley-Interscience Publication, Built-In Test for VLSI: Pseudorandom Techniques, whose teachings are incorporated herein.

Figures 10A, 10B:
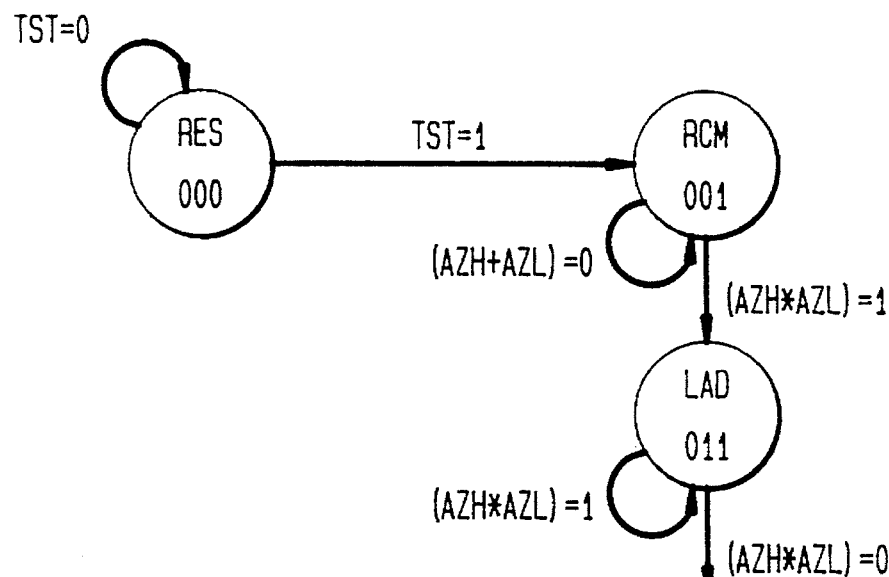
FIG. 10A is a tabular listing of all outputs for different states of a controller for testing a counter in accordance with the invention.
FIG. 10B is a state diagram of a controller 14 during a testing cycle.

Note that in the discussion to follow, a logic "1" is also referred to as a "high" or "High", or as a "one" or "1". A logic "0" is also referred to as a "low" or "Low", or as a "zero" or "0". The operation of the synchronous binary down counters and their associated counter partitioning circuitry, the logic section 11a, MUX 16 and MISR 18 is controlled by a controller section 14. The controller 14 has an output RCN1 connected to partitioning circuit 102b and an output RCN0 connected to partitioning circuit 104b. Signals RCN1 and RCN0 are used to selectively control the partitioning ("reconfiguration") of the counters 102a and 104a in response to an active test counter signal (TST), applied to controller 14 from a tester 19. Controller 14 also has an output signal RST and an output signal CLD coupled to logic section 11a. RST functions to reset the stages of counters 102a and 104a such that all the "Q" outputs are reset to "zero" in states RCM, SFT and LST, as shown in FIG. 10A. CLD functions to control the loading of numbers "M" and "N" into the counters in states RCM, LAD, SFT and LST, as shown in FIG. 10A. The controller 14 also has outputs HLS0, HLS1, and HLS2 connected to MUX 16 to determine the sequence in which the sections of the partitioned counters (102a and 104a) and their outputs get coupled via MUX 16 to MISR 18. The controller also supplies an inhibit signal (INH) and a MISR positive clear (MPC) signal to MISR 18. The INH signal, when driven to zero, functions to freeze the count in the MISR 18 when the controller 14 is in states LAD and SFT as shown in FIG. 10A. The MPC signal produced by controller 14 functions, when high, to clear the MISR 18 and to set all its outputs to zero. In FIG. 2, the fin signal supplied by tester 19 to the controller 14 is also applied to the counter 102a. A clock signal fx which may take on different values is supplied to MISR 18; fx is equal to fin when counter 102a is being tested and is equal to fo when counter 104a is being tested.

Section 11a supplies zero detect signals AZL0, AZL1, AZL2 and AZH0, AZH1, AZH2 to the controller 14. Each one of the AZL and AZH signals corresponds to a counter section and goes high when all the outputs of the stages in its corresponding counter section go to zero. The role of the AZL and AZH signals is further detailed below.

Controller 14 is shown connected to a tester 19, external to the IC 2, which functions to initiate the testing and to evaluate the results of the testing to determine the operability of the counters used in the frequency synthesizer system. In FIG. 2, the tester 19 supplies three signals to controller 14. One signal is a test initiate signal (TST) which causes the controller to initiate the partitioning and testing of the counters. Another signal is a shift signal (SHF) which is applied to the controller 14 by the tester a period of time after the generation of the TST signal and the receipt of a test complete (TCM) signal from the controller. The SHF signal functions to initiate the read-out of the "signature" information present in the MISR 18 at the completion of a test cycle. The third signal supplied by the tester 19 is a clock signal (CK) of frequency fin which is supplied to the controller 14 for application and distribution to the frequency synthesizer system.

The controller 14 supplies a high level test complete TCM signal to the tester 19 indicating that a test cycle has been completed. This occurs in response to an AZH signal going high in the CTH state, as discussed below. Following receipt of a high level TCM signal the tester 19 produces a high level SHF (shift) signal which is applied to controller 14 and which, in response thereto, causes the MISR 18 to shift out a serial "signature data output" (SDO) signal which is coupled to the tester 19. In FIG. 2, the signal SDO is shown applied to the controller 14 which then supplies optional signals SDOB and PAS to the tester 19. However, SDO may be directly applied to the tester 19. The tester 19, after reviewing the SDO signal (or its derivative), determines and indicates whether the counter(s) operated under prescribed test conditions has generated the correct signature and is or are operating correctly. The output fo of VCO 107 may be coupled to other circuitry (not shown) on the IC2 or to a dedicated pin of the IC2. Also, as shown in FIG. 2, fo may be coupled to the tester 19.

Figure 3:
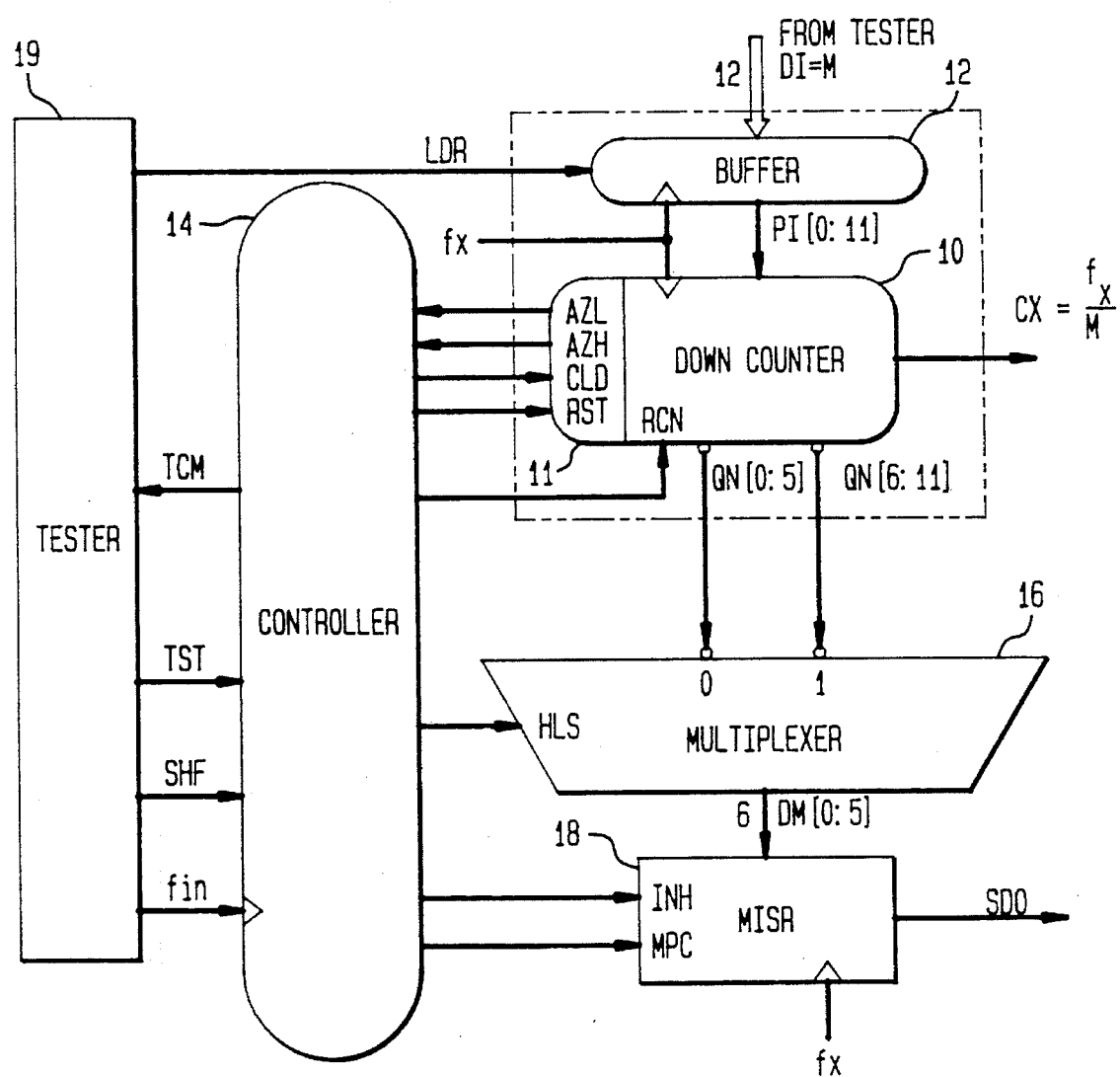
FIG. 3 is a block diagram of a counter and its associated test circuitry suitable for use in the system of FIG. 2.
Figure 5:
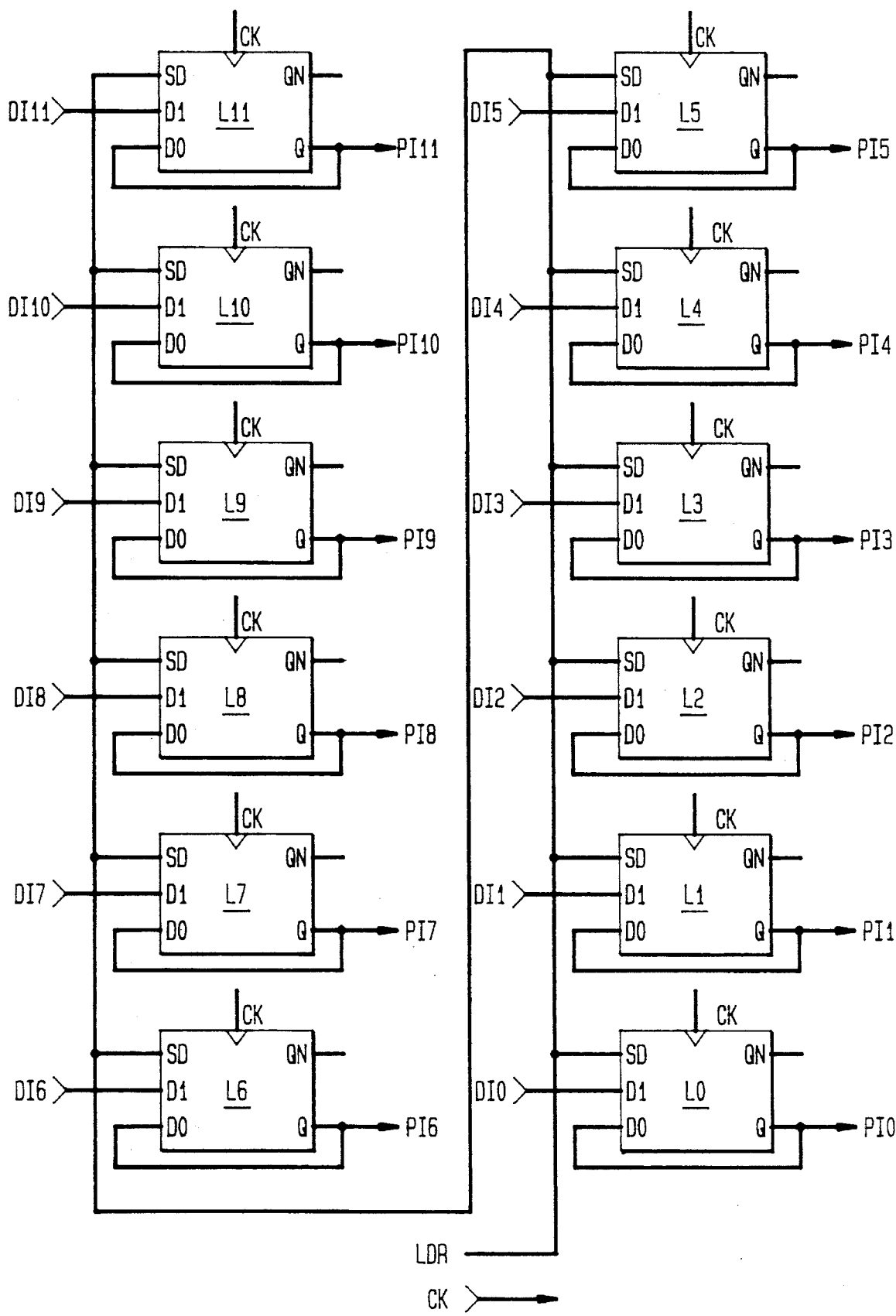
FIG. 5 is a diagram in block form of a buffer register 12 suitable for use in conjunction with a synchronous binary counter in systems embodying the invention.

To better illustrate the invention and for ease of discussion, FIG. 3 shows the testing circuitry associated with a single synchronous down binary counter 10. The circuit of FIG. 3 suitably modified in accordance with the invention may be used as any one of the counters employed in a frequency synthesizer system of the type shown in FIG. 2. FIG. 3 shows a down counter 10 which for ease of illustration is assumed to be 12 bits long; i.e., the number of stages N is equal to 12. FIG. 3 also shows a buffer 12 comprised of latches configured as shown in FIG. 5 to enable the storing and application (loading) of data signals, in parallel, to the counter 10. In normal operation, the counter 10 counts down from a count (e.g., M) loaded from buffer 12 into the stages of counter 10 until an all "zeros" condition is produced at the outputs of all the counter stages. When the all zero condition is detected this has the effect of down loading the number loaded from the buffer 12. The cycle of M down counts repeats causing the carry out (CX) signal to toggle at a frequency which is M times lower than the clock frequency (fx); (i.e., CX is equal to fx/M). In FIG. 3 a number "M" loaded into the latches of buffer 12 is predetermined by the tester 19 or another external source (not shown). The number "M" loaded in the buffer 12 is selectively transferred from the latches of buffer 12 to corresponding stages of the counter 10 under control of a load register (LDR) signal supplied from the tester to the buffer 12.

As discussed for FIG. 2, the tester supplies signals TST, SHF and fin to the controller and the controller supplies the signal TCM to the tester. The controller also supplies signals CLD, RST, RCN, HLS, INH and MPC to the counter and its associated circuitry and the counter circuitry supplies signals AZL and AZH to controller 14. Assuming the down counter 10 to be partitioned into two equal sections, the outputs of each section (QN0-to-QN5 and QN6-to-QN11) are coupled via a multiplexer (MUX) 16 to a multi-input signature register (MISR) 18 which sequentially compacts the outputs of each section and shifts out the final result (SDO) when the shift signal (SHF) becomes high after a test sequence has been completed with TCM having been set to logic "1". The compacted information (SDO) shifted out serially from MISR 18 represents the signature of the data and it is this serial signature which is the basis for determining whether the counter is in "good" working condition. The partitioning of the counter and the flow of the signals is controlled by means of controller 14 coupled to counter 10, multiplexer 16, and MISR 18, as further detailed in FIG. 4.

Figure 4A:
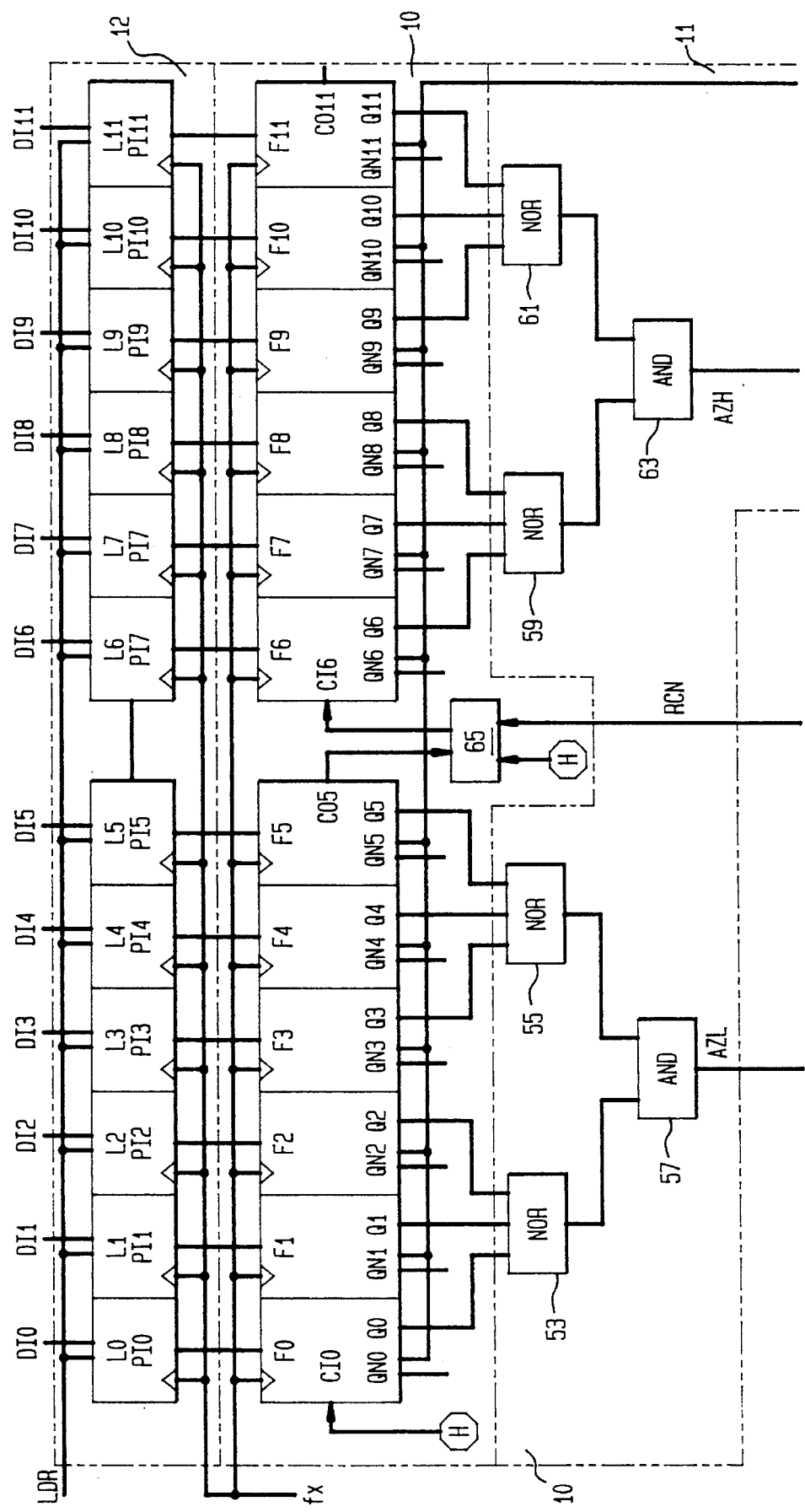
FIG. 4 is a detailed block diagram representation of a counter and its associated test circuitry suitable for use in the system of FIG. 3.
Figure 6A:
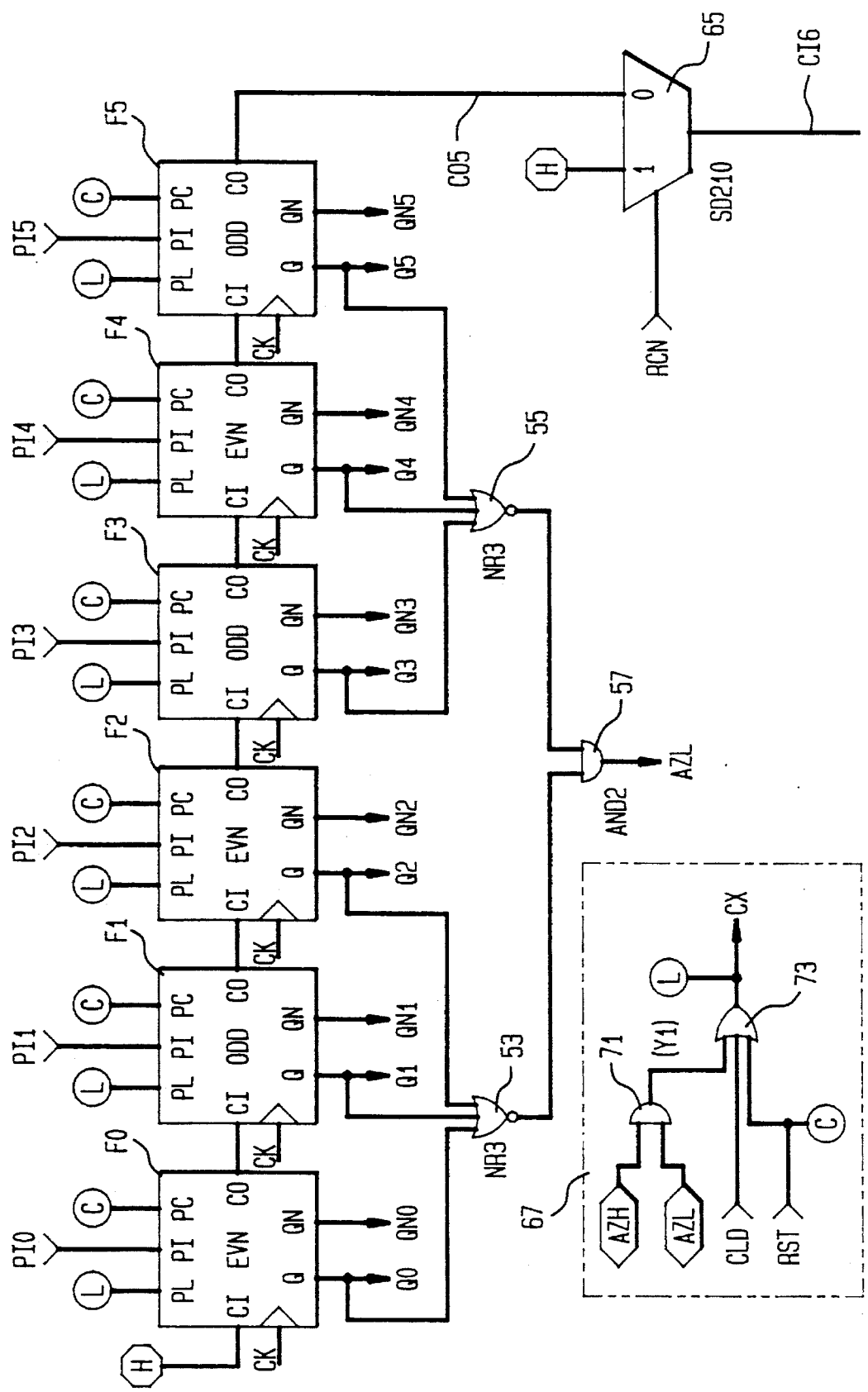
FIG. 6 is a more detailed block diagram of blocks 10 and 11 of FIG. 4, showing counter stages interconnected to form a counter 10 and associated logic circuitry, in accordance with the invention.
Figure 6B:
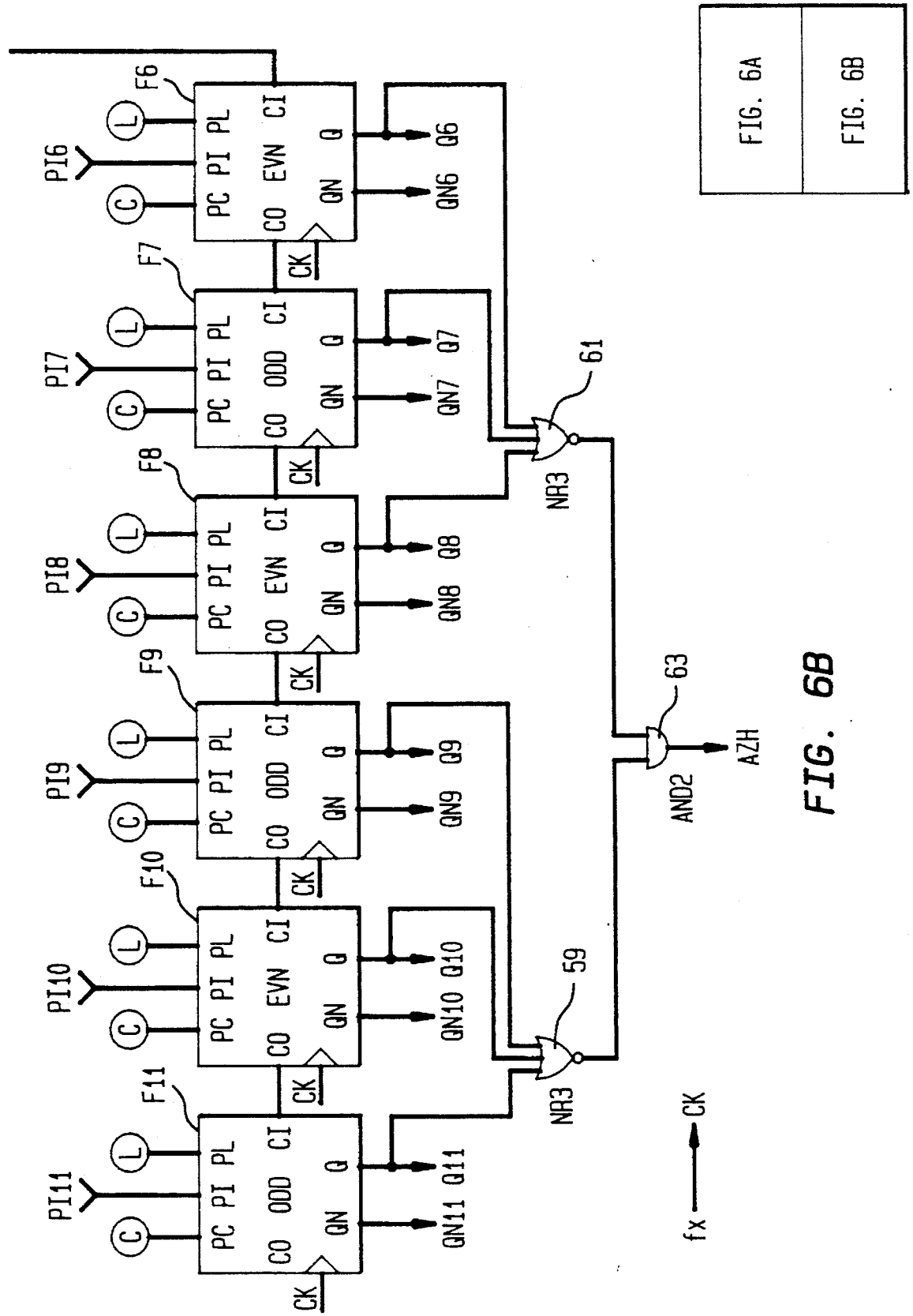
Figure 7A:
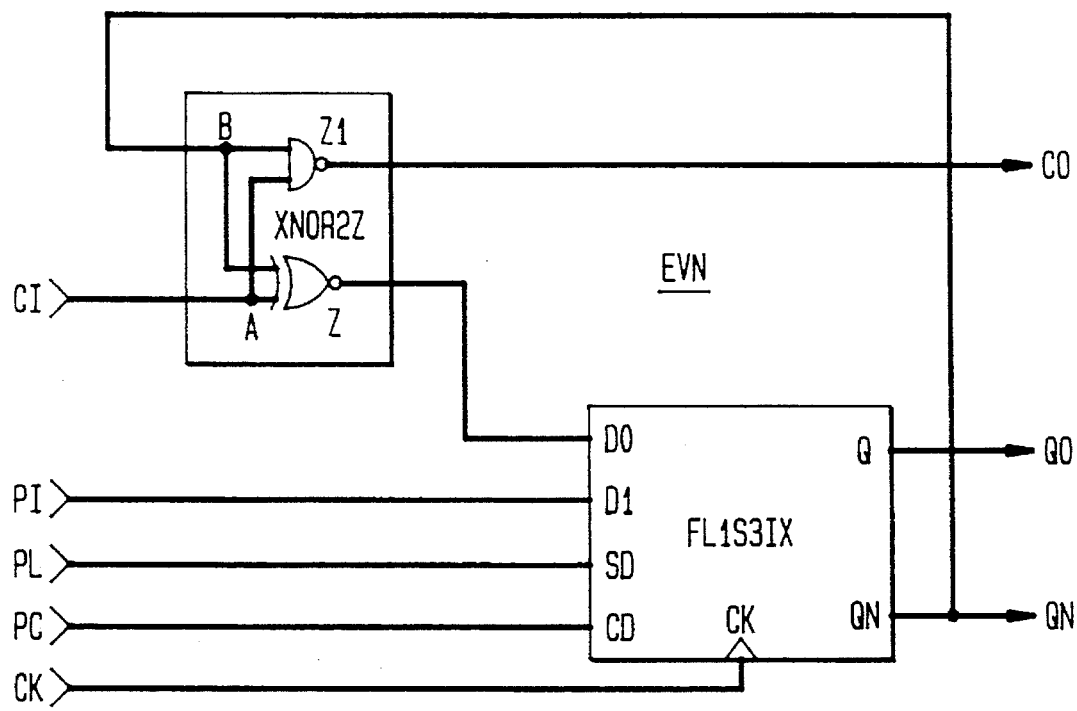
FIGS. 7A and 7B are diagrams in block form of the even and odd counter stages used to form a counter 10 suitable for use in systems embodying the invention.
Figure 7B:
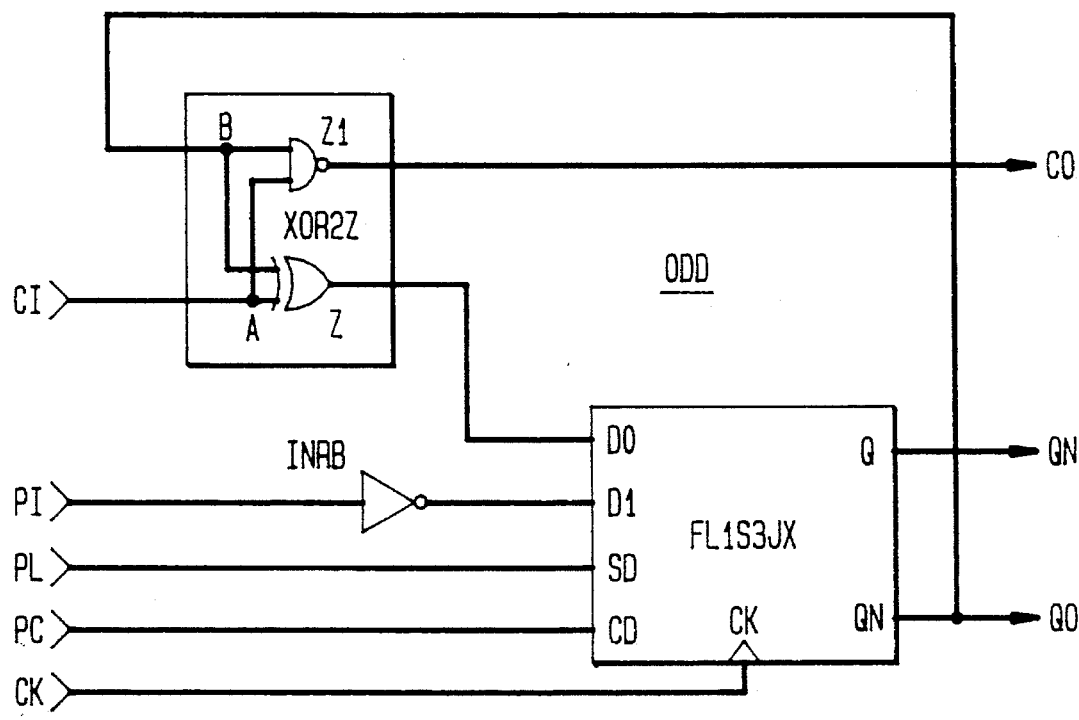

Referring to FIG. 4, there is shown a 12-bit synchronous down binary counter 10 comprised of 12 stages (F0–F11) which may be interconnected as shown in FIG. 6, with the stages of counter 10 being as shown in FIGS. 7A and 7B. [Counters 102a and 104a of FIG. 2 may be formed like counter 10, with 24 bit counter 104a being made twice the size of 12 bit counter 10.] The stages (F0–F11) of counter 10 are arranged to be selectively loaded, in parallel, from a buffer 12. Buffer 12, as shown in FIG. 5, includes twelve latches (L0–L11), one latch (Li) corresponding to each one of the stages (F0–F11) of counter 10. Each one of the latches (Li) has a data input (Di) and a corresponding parallel output (PLi). The data inputs (Di) to the various latches may be set, by means of an external source such as tester 19, to either a "1" or a "0" depending on the divide-by count to be loaded into the corresponding counter stages (F0–F11). The tester 19 or another external source activates a load register signal (LDR) which causes the latches (Li) to get set to the value of their respective Di and to then couple that Di onto their corresponding parallel output lines (PLi) for setting their corresponding (Fi) counter stage. The latches Li hold and retain the initial count which is down loaded to the counter 10 when a count of zero is reached.

Each stage (Fi) of counter 10 produces an output Qi and the complement of that output, QNi. In FIG. 4, the 12 stages of counter 10 are divided into two groups; a first group consists of the lower six stages (F0 through F5), and a second group consists of the higher or upper six stages (F6 through F11).

A multiplexing gate 65 is coupled between the output CO5 of the sixth stage F5 of counter 10 and the input CI6 of the seventh stage F6. The conductivity condition, or state, of gate 65, is controlled by a "reconfigure" control signal RCN produced by controller 14 and applied to gate 65. Gate 65 is a non-inverting multiplexing gate and may be a multiplexed transmission gate or any other known and suitable non-inverting multiplexing gate. As detailed below and as shown in FIG. 6, when gate 65 is in one state (RCN=0) the output CO5 is directly applied to the input CI6 of F6; and when the gate 65 is in the other state (RCN=1) the same signal (H) is applied to the input (CI6) of F6 as is applied to the input (CI1) of the first stage, F0.

IN FIG. 4, the "Qi" outputs of stages F0, F1, and F2 are applied to the inputs of a NOR gate 53 and the "Qi" outputs of stages F3, F4, and F5 are applied to the inputs of a NOR gate 55. The outputs of NOR gates 53 and 55 are applied to the inputs of an AND gate 57 to produce an output signal AZL indicative of the state of the lower (L) six stages of counter 10. The output AZL signal will be high when all the outputs (Q0–Q5) of the lower section of the counter 10 are low (i.e., when there is an All Zero in Lower section of counter 10). In a similar and symmetrical fashion to the one just described, the "Qi" outputs of stages F6, F7, and F8 are connected to the inputs of a NOR gate 59 and the "Qi" outputs of stages F9, F10, and F11 are connected to the inputs of a NOR gate 61. The outputs of NOR gates 59 and 61 are applied to the inputs of an AND gate 63 to produce an output AZH indicative of the state of the higher (H) six stages of the counter 10. The output AZH will be high when all the outputs (Q6–Q11) of the higher section (F6–F11) of the counter 10 are low (i.e., for an All Zero condition present in the Higher section of the counter).

Gate 67 of FIG. 4 is a combinational logic gate whose structure and function is best explained with reference to the more detailed showing in FIG. 6. The signals AZL and AZH are applied to the two inputs of an AND gate 71. The output (Y1) of AND gate 71 and the signals CLD and RST are applied to the three inputs of an OR gate 73 to produce a signal CX also defined as L. As shown in FIG. 6, CX or L is connected to the load inputs (PL) of all the counter stages. Gate 67 functions as a load signal generator for the counter 10. The output CX of gate 67 goes high when AZH and AZL are both high or when signals CLD and/or RST are high. Signals CLD and RST are produced by controller 14. RST and CLD will both be high for the states RCM, SFT and LST and CLD will also be high for the state LAD, as shown in FIG. 10A. Normally, when any of the inputs Y1, CLD or RST applied to the inputs of gate 67 goes high, its output goes high producing a signal carry out (CX) indicating that all the counter stages have gone to zero and/or that the counter stages have to be reloaded (refreshed).

When the counter 10 and its associated circuitry shown in FIG. 4 is substituted for counter 10a of FIG. 2, fx applied to the CK input of the counter stages and MISR 18 is the input clock fin and the output signal CX corresponds to fr. When the counter 10 and its associated circuitry shown in FIG. 4 is substituted for counter 10b of FIG. 2, fx corresponds to fo (after it has been amplified and appropriately digitized) and CX corresponds to ff.

Any suitable counter stage may be used to form counter 10. However, it is preferred that the counter and the stages be synchronously operated. Such operation ensures that the circuit responds to the same clock signal transition and avoids the accumulation of propagation delays associated with ripple down binary counters.

In a preferred embodiment, the counter stages shown in FIGS. 7A and 7B were used for the even and odd numbered stages of counter 10. The structure and operation of these stages is known in the art and need not be greatly detailed. In FIGS. 7A and 7B, the FL1S3IX and FL1S3JX are static D-type flip-flops responding to a positive edge trigger and with data select at the front end and with a positive synchronous reset (for Ix) and preset (for Jx). CI represents the carry input; CO represents the carry output. PI is a data parallel input terminal adapted to receive data input from a corresponding latch; PL is a control line which may be defined as "positive load" and determines whether D0 or D1 is applied to the Q output of the stage. When PL applied to the SD (select data) input of the stage is high, the D1 input is coupled to the Q output; and when PL and SD are low, the D0 input is coupled to the Q output; the positive clear (PC) signal is a control signal connected to the clear data (CD) or the preset data (PD) input of the stage. When PC is high, the Q output of the stage is driven to zero. Therefore, for counting to occur, the PC line must be low.

Referring to FIG. 6, note that the reset signal (RST) from the controller is routed to all the PC inputs of stages F0–F11. The CX or L output is routed to all the PL inputs of stages F0–F11. The PIi inputs are connected to the PIi outputs of their corresponding latch and the same clock signal fx is applied to all the stages.

Referring back to FIG. 4, The "QN" outputs of the counter stages (QN0 through QN11) are coupled to multiplexer (MUX) 16 having six multiplexing gates (161 through 166). Each one of the multiplexing gates has one input from the lower set of counting stages and one input form the higher set of counting stages. Thus QN0 and QN6 are applied to gate 161; QN1 and QN7 are applied to gate 162; QN2 and QN8 are applied to gate 163; QN3 and QN9 are applied to gate 164; QN4 and QN10 are applied to gate 165; and QN5 and QN11 are applied to gate 166. The multiplexing gate 161 through 166 are controlled by a signal HLS (high or low section select) supplied by controller 14. When HLS is low the signals coming from the lower stages (QN0 through QN5) are coupled onto the output lines (DM0 through DM5) of the multiplexing gates which are connected to the inputs of MISR 18 and when HLS is high the signals coming from the higher counting stages (QN6 through QN11) are coupled onto the output lines of the multiplexer gates which are connected to the inputs of MISR 18.

Figure 9A:
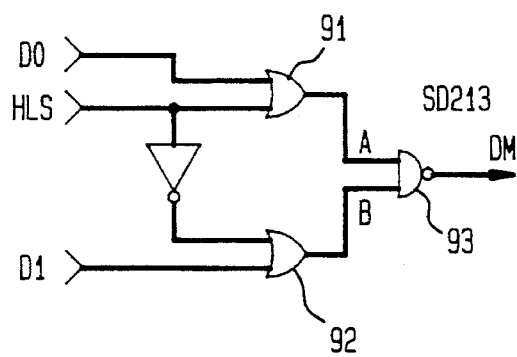
FIG. 9A is a detailed diagram in block form of a multiplexer stage suitable for forming a multiplexer 16.
Figure 9B:
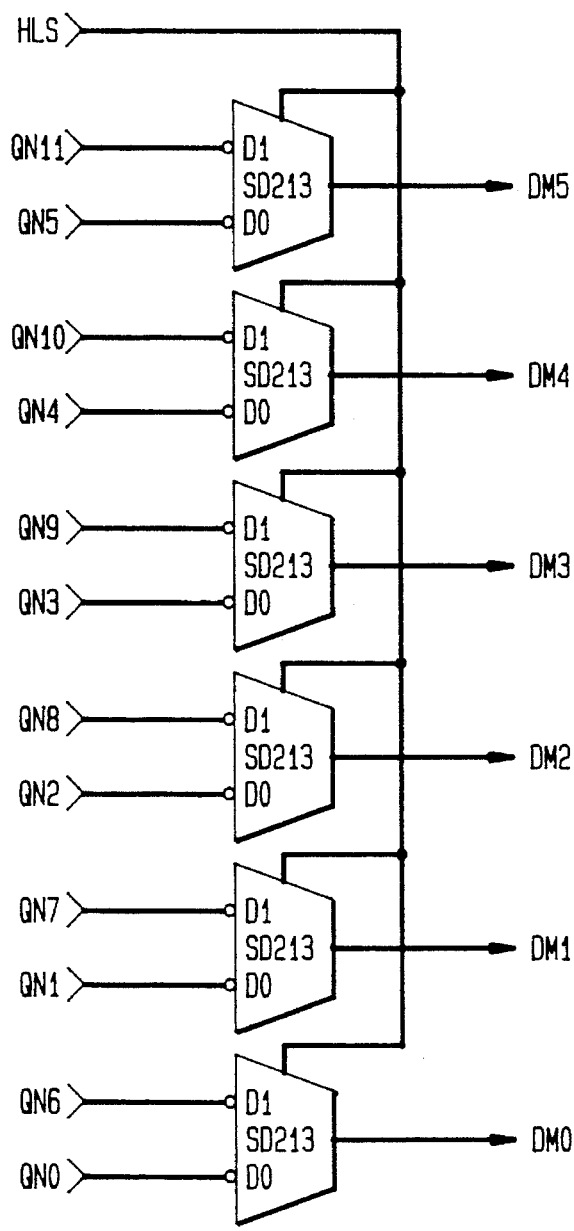
FIG. 9B is a block diagram detailing a multiplexer 16 suitable for use in the circuits of FIGS. 2, 3 and 4.

The operation of MUX is better explained with reference to FIG. 9A which details the logic structure of each gate of MUX 16 illustrated in FIG. 9B. When HLS is High, the output (A) of NOR gate 91 is always High and the output (B) of NOR gate 92 is equal to D1. The output (DM) of NAND gate 93 is then equal to the inverse of D1. When HLS is Low, the output B is always High and the output A is equal to D0. The output DM of NAND gate 93 is then equal to the inverse of D0. Therefore, when HLS is High, the signals QN6–QN11 are coupled via MUX 16 to DM0–DM5 and when HLS is Low, the signals QN0–QN5 are coupled via MUX 16 to DM0–DM5. Due to the inversion of the MUX 16 gates, Q0–Q5 and Q6–Q11 are effectively supplied to MISR 18.

In the circuit of FIG. 4 and in accordance with the invention, during a first portion of the testing cycle, the lower section of the counter is used to count and detect the number of clock cycles needed to drive the lower stages count to zero. During this first portion, while waiting for AZL to go high, the outputs of the six high counter stages (QN6 through QN11) are coupled via the multiplexer 16 to the MISR 18. During a second portion of the testing cycle, the upper section of the counter is used to count and detect the number of clock cycles needed to drive the upper stages count to zero. During this second portion, while waiting for AZH to go high, the outputs of the six low counter stages (QN0 through QN5) are coupled via multiplexer 16 to MISR 18. More specifically, assume, for example, that, during the first part of the testing cycle, the lower six stages (F0–F5) have been loaded to an all "one's" condition and that they are counting down to zero. During this first part of the testing cycle the outputs of the upper six stages (F6–F11) are coupled via MUX 16 to the inputs of MISR 18, where the counts are being compacted. Then, during the second part of the testing cycle, the upper six stages are first reloaded to an all "one's" condition and they are then made to count down to zero during the second part of the testing cycle. During this second period, the outputs of the lower stages are coupled via MUX 16 to the inputs of MISR 18 where the outputs of the lower stages are compacted in addition to the sum of the outputs previously compacted by MISR 18 during the first part of the testing cycle.

When AZL goes high (indicating that the lower six stages have counted down to zero), the high AZL signal is applied to the controller 14. This causes the controller to go into a CTH state during which the output HLS signal goes low. When HLS goes low, the outputs (Q0 through Q5) of the six lower counting stages are coupled via the MUX 16 to MISR 18. Concurrently, the six upper stages (F6–F11) which had been reset (e.g., to an all one's condition) start counting down until their outputs (Q6 through Q11) are all zero. When this condition is reached, AZH goes high. When the condition of AZH being high is detected and applied to the controller, the controller freezes the count accumulated in the MISR 18 for subsequent comparison and/or analysis in the tester 19 or the controller.

The outputs of multiplexer 16 are coupled to the data inputs of MISR 18. Each output of the multiplexer 16 is coupled to a corresponding input (DM0 through DM5) of MISR 18. The operation of MISR 18 is controlled by control signals INH and MPC applied to MISR 18 from the controller 14 and a clock signal applied to MISR 18 from the controller 14.

The control signal INH functions to inhibit operation of MISR 18 when INH is low (logic "0"). That is, when INH is low, MISR 18 holds and maintains the data previously compacted. The control signal MPC functions to clear or reset the MISR 18 when MPC is high (logic "1") thereby setting the QX output of all the stages in FIG. 8 to zero. The clock signal fx is applied to the clock input (CK) of all the stages of MISR 18 shown in FIGS. 8A and 8B. The clock signal fx is applied to all the stages in parallel to provide synchronous operation. The MISR 18 has an output SDO at which is produced a compacted serial signal SDO indicative of the total count compacted by the MISR 18.

Figure 8A:
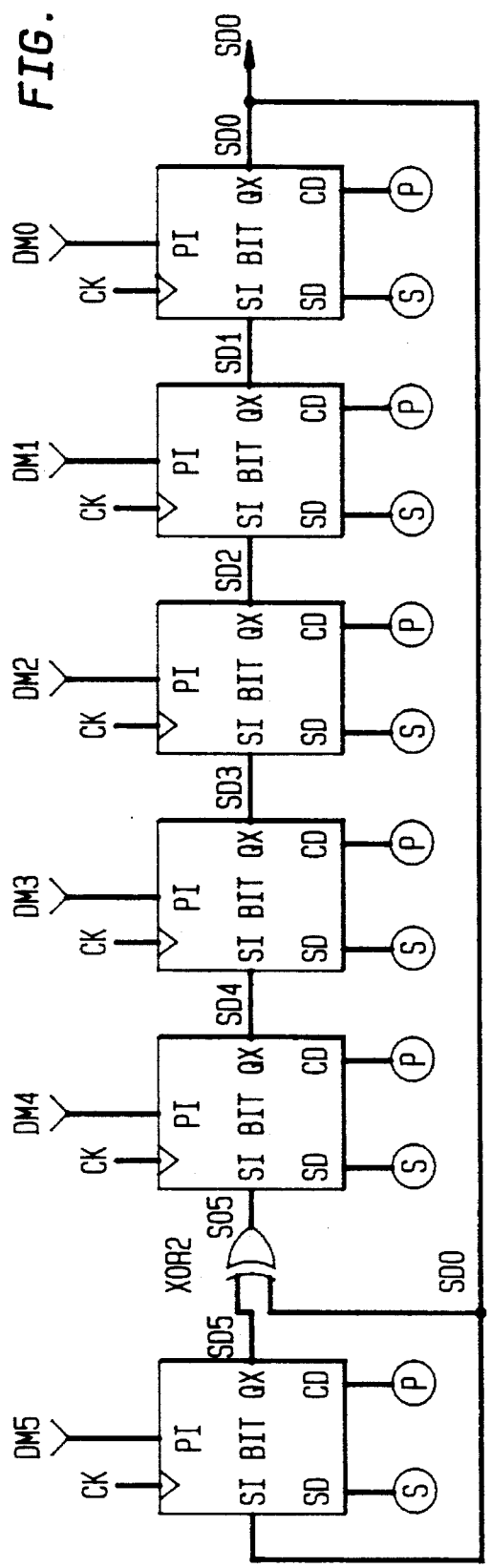
FIG. 8A is a block diagram of a multi-input shift register (MISR) 18 suitable for use in the circuits of FIGS. 2, 3 and 4.
Figure 8B:
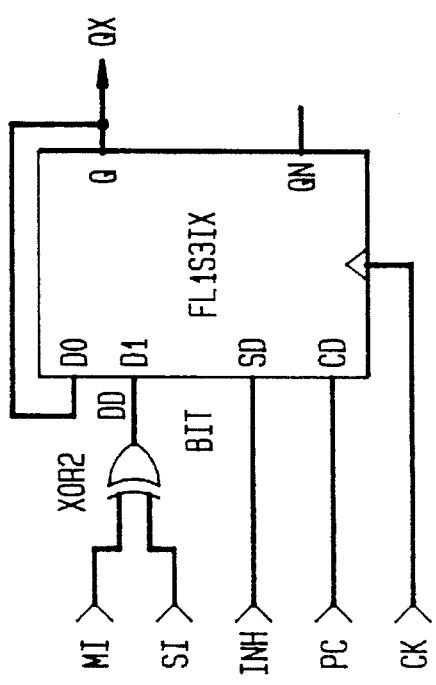
FIG. 8B is a detailed block diagram of one stage of the MISR 18 of FIG. 8A.

The detailed operation of the MISR 18 is best explained with reference to FIGS. 8A and 8B. In the figures, a parallel signature testing method employing a Multiple-Input Signature Register (MISR) is used to practice the invention. As shown in FIG. 8B, each stage of the MISR includes an FL1S3IX which is a static D-type flip-flop which is positive edge triggered with data select at the front end and with positive synchronous clear. Also, as detailed in FIG. 8B, the MI input is a parallel input from the MUX 16 and the SI input is the serial input from a previous Qx output stage of the MISR. The MI and SI signals are coupled via an exclusive OR gate to the D1 input of the D-type flip-flop. An inhibit signal (INH) from the controller is applied to the select data (SD) input. When INH is High, the D1 input is coupled to the Q output; and when INH is Low, D0 is coupled to the Q output. Note that in FIGS. 8B and 8A, the Q of each stage is connected to its D0 input. Hence, as configured, when INH is Low, SD is Low and Q does not change, whereby the data in the register is frozen. Hence in the MISR a modulo 2 adder (exclusive OR) is placed between each of the MISR stages. It is driven by one of the circuit outputs which forms the divisor feedback which also feeds the adder at one of the stages. The 6-bit Multi-Input Signature Register (MISR) compresses (compacts) the data based on divisor polynomial: $f(X)=X^6+X+1$ The initial state of the MISR is zero. The last expression is the remainder signature of the fault-free circuit which is the final state of the MISR after a sequence of n tests has been applied. The signature can be computed by knowing the circuit responses of each test of the test sequence. All of the operations in MISR are linear. The error polynomials can be considered as being compressed independently.

In the absence of a test command (i.e., TST=0), the counter operates as known in the prior art. In the presence of, and in response to, a test command (i.e., TST=1) the testing of the counter may be briefly summarized as follows:

1—The counter is reset such that all its Q outputs go low. The logic circuitry detects the presence of the all zero condition in the counters (AZL and AZH are both high). This functions to quickly test the resettability of the counters and that the peripheral logic circuitry is also operational.

2—The counter is set to a non-zero condition. For ease of discussion and illustration it will be assumed that the counter stages are set to an all one's condition. However it should be appreciated that the counters could be set to a lesser number which would result in requiring fewer cycles of the clock to complete a test sequence. The logic circuitry detects the presence of the non-zero condition in the counters (e.g., for the all one's condition both AZL and AZH are low). This functions to quickly test the settability of the counters and the operability of the associated peripheral logic circuitry.

3—The counter is partitioned into sections. In the circuit of FIG. 4 the counter is partitioned into two sections, each section having six stages.

(a) One section (e.g., the lower six stages) counts a preset number of clock cycles (e.g., until AZL goes to zero) while the outputs of the counter stages from the other section (e.g., the upper six stags) are being summed or totalled in the MISR 18.

(b) Then, the other section (e.g., the upper six stages) counts a given number of cycles while the outputs from the one section (the lower six stages) are summed or totalled in the MISR 18.

Thus, during each portion of a test cycle one section of the counter functions as a reference counter or timer for the other section. For a twelve stage counter, partitioned into two sections, with each section reset to an all one's condition, it will take $2(2^6)$ (or 128) cycles to cycle through all the states of the counter stages. This compares to $2^{12}$ (or 4,096) cycles needed to test all the states of a non-partitioned 12 stage counter.

4—The total count accumulated or compacted in the MISR 18 is then evaluated by a tester or controller to determine that the totalled count is correct. The time required for the entire test cycle is then equal to the set up time to reset and set the counter and the time to test the partitioned sections of the counter and the time to read out the totalled count and make the comparison.

Figure 10C:
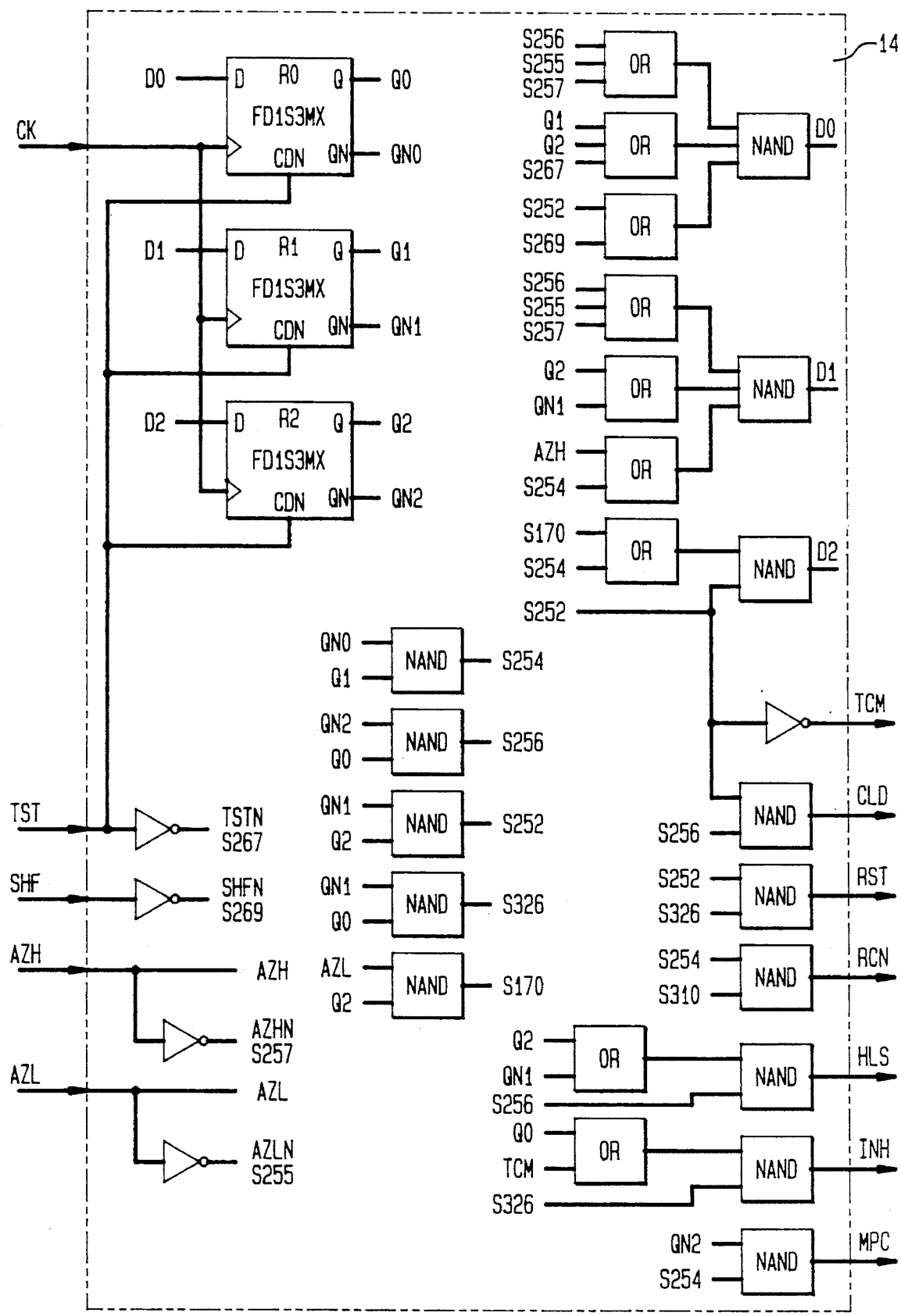
FIG. 10C is a block diagram of a controller useful in systems embodying the invention.

A more detailed outline of the testing sequence of the counter of FIGS. 3 and 4 is best explained with reference to the controller state diagram, the flow chart diagram and the block diagram shown, respectively, in FIGS. 10A, 10B and 10C.

I—When the TST signal is low (NO TEST SELECTED), the controller 14 is in the RES state for which Q0, Q1, and Q2 of registers R0, R1, R2 are all at zero. For the RES state the outputs of the controller 14 are such that signals TCM, CLD, RCN, and HLS are all low and signals INH and MPC are high. In this state it is critical to note that RCN is low, which means that gate 65 is coupling the output CO5 of F5 to the input CI6 of F6. The counter 10 and the frequency synthesizer system then functions in its normal mode. AZL and AZH go to zero when the full counter counts down or goes to zero causing CX to go high and reset the counter stages to the desired count. Thus the portion of the logic network comprising gates 53, 57, 59, 61, 63, and 67 is always functioning; i.e., in the normal mode and in the test mode.

II—A test mode or period is initiated by the tester M when the tester produces a High TST signal and applies it to the controller 14. In response to TST being set High, the controller 14 is set to the RCM state for which the registers R0, R1, and R2 in controller 14 are set such that their Q0=1, Q1=0, and Q2=0. In the RCM state the output signal TCM is low while output signals CLD, RST, RCN, HLS, INH, and MPC are all high.

1—In response to RST and CLD going high, the output stages of counter 10 and the MISR 18 are reset to an all zero's condition.

2—In response to RCN being high, transmission gate 65 breaks the connection between CO5 and CI6. Instead, gate 65 now connects terminal H to CI6 of F6. A High signal is applied to the H terminal which is directly connected to the CI of F0 and to the CI6 of F6.

3—Since counter 10 is reset to an all zero condition, Q0–Q11 of F0–F11 are all set to zero. In response to this condition, the signals AZL and AZH go high. This condition provides an indication as to the resettability of the counter stages and the operability of the logic circuitry producing AZL and AZH. If AZL and AZH fail to go high, the system testing does not advance to the next phase, and an immediate fault indication will be provided, eliminating the need for further testing.

4—In response to HLS being high, MUX 16 is set such that the outputs Q6–Q11 of stages F6–F11 are coupled to the inputs (DM0–DM5) of MISR 18.

5—In response to MPC being high the outputs (Qx's) of MISR 18 are set at zero. Therefore, though INH is high, the MISR 18 does not accumulate and compact any signal and its output remains at zero.

III—When signals AZL and AZH go high and are applied to the controller 14, the controller is placed in the LAD (loading) state for which the outputs of registers R0, R1 and R2 are set such that their Q0=1, Q1=1 and Q2=0. For the controller in the LAD state, its outputs assume the following conditions: TCM=0, CLD=1, RST=0, RCN=1, HLS=1, INH=0, and MPC=1. In going from the RCM state to the LAD state, output RST has gone to zero enabling the counter 10 to be loaded to a preset count stored in buffer 12. With INH at zero and MPC at one the MISR does not count. But, as already noted, in response to AZL and AZH going high, counter 10 is loaded with a number other than zero. For purpose of illustration assume that counter 10 is loaded with an all one's condition. When this condition is detected, AZL and AZH go low. This condition also indicates that the counter is loaded and settable to a predetermined count. When the condition that AZL and AZH are low is applied to controller 14, the controller responds by advancing to the next state (i.e., CTL).

IV—In the CTL state the registers R0, R1 and R2 are set such that their Q0=0, QI=1, and Q2=0, which defines the CTL (count low section) state. For the CTL state the outputs of the controller assume the following conditions: TCM=0, CLD=0, RST=0, RCN=1, HLS=1, INH=1, and MPC=0.

1—With CLD and RST at zero the counter can count the cycles of the clock signal (fx) applied to the CK inputs of the counter 10.

2—With RCN being high the counter 10 is partitioned into two sections, the upper section (stages F6–F11) and the lower section (stages F0–F5). With the onset of the CTL phase, each section proceeds to count down from a number to which they have been preset down to zero.

3—With HLS being high, the multiplexer is controlled to allow the outputs (Q6–Q11) of the upper half of the counter 10 to be applied to the inputs of the MISR 18.

4—With INH being high and MPC being low, the MISR is in a condition to receive and compact the counting signals it receives from the outputs of Q6–Q11.

With RCN set to the partition mode, multiplexer gate 65 blocks the output (CO) of stage F5 from being coupled to the input (Ci) of stage F6. Instead, a "High" signal (typically the VDD of the system) is applied to the input (Ci) of stages F0 and F6. The "High" signal allows both sections of the down counter to count down in a similar fashion. For the condition of the first six stages being set to an all one's condition, it will take 63 cycles of the fx clock for the first six stages of counter 10 to count down to zero. Concurrently, the outputs of the second six stages of the counter are also counting and their outputs are applied to MISR 18 which functions to accumulate and compact the data received.

The outputs of the first three stages and the outputs of the second three stages are each supplied to respective NOR gates 53, 55. When all the inputs to the NOR gates go low, their outputs go high. Thus, when the outputs of NOR gates 53 and 55 both go high and are applied to AND gate 57, the output (AZL) of gate 57 also goes high.

Thus, during the CTL phase, a clock signal (fx) is applied to the two sections of counter 10 (which count down to zero), and to MISR 18. The lower six stages (F0–F5) function essentially as a timer counting the number of shift cycles applied to the upper six stages (F6–F11) whose outputs are routed via MUX 16 to MISR 18 for compaction. When the first six stages have counted down to zero, the condition is detected and AZL goes high. Concurrently, the outputs of the upper half of counter 10 (stages F6–F11) are coupled via the MUX 16 to MISR 18 where the data is being compacted. The CTL phase which defines the first portion of the testing cycle ends when AZL goes high.

V—The application of a high AZL signal to the controller 14, sets the controller 14 to the CTH state with the registers R0, R1 and R2 of the controller set such that their Q0=0, Q1=1 and Q2=1.

1—In the CTH state all the outputs of the controller 14 remain the same as in the CTL state except for HLS which is set to zero. HLS being set low causes the outputs of the six lower stages to be coupled via MUX 16 to MISR 18, and the upper half of the counter 10 to be monitored until AZH goes high.

2—At the outset of the CTH phase the upper six stages as well as the lower six stages are reset and reloaded from an all zero condition to an all one's output, which was the original number loaded into the counter. This is accomplished automatically by allowing the next clock cycle after AZL goes high to be applied to the counter and resetting it. Alternatively, this could be accomplished by enabling the loading of the data register 12 into the counter stages.

3—During the CTH phase, the count down of the upper six stages is monitored to sense when the outputs of the upper six stages reach the all zero condition at which point AZH goes high. The upper six stages now function as the timer counting and determining the number of clock cycles by which the lower stages are to be shifted.

4—While AZH is being monitored, the outputs of the lower six stages of counter 10 are coupled to MISR 18 via MUX 16, where the data is being compacted, in addition to the data previously received (during CTL) from the upper six stages.

5—When the outputs of the upper six stages reach an all zero condition, the condition is detected and AZH goes high. As before, if the circuit is operating correctly, it will take 63 cycles of the clock (fx) for the condition to be reached. Applying the High going AZH signal to the controller, causes the controller to advance to the SFT state and the cycling of the counter 10 is terminated.

VI—In response to AZH going high, controller 14 is set to the SFT (shift) state with the registers R0, R1 and R2 set such that their Q1=0, Q1=0 and Q2=1. In the SFT state and in response to AZH going high, the controller outputs assume the following values: TCM, CLD, RST, and RCN are high while HLS, INH and MPC are low.

1—When the TCM (test complete) signal goes high, which signal is applied to the tester 19, it signals to the latter that the testing is completed and that "signature data" is available for shifting out of MISR 18 to the tester 19 or to the controller.

2—IN the SFT state, CLD and RST go to the high state resetting the counter.

3—RCN still remains in the high state maintaining the counter 10 partitioned into two sections.

4—HLS remains in the zero state.

5—INH goes to the zero condition to freeze the count accumulated in MISR 18 and to inhibit or stop the addition of further numbers in MISR 18. MPC remains in the zero state and has no effect on MISR 18.

VII—In response to the receipt of a high TCM signal, the tester 19 supplies a shift out signal (SHF=HIGH) to the controller 14. In response to SHF going high, the controller is set to the LST (last) state in which registers R0, R1 and R2 are set such that Q0=1, Q1=0 and Q2=1. In the LST state, the outputs of controller 14 remain the same as in the SFT state, except for INH which goes from low to High. When INH is High, the data (signature) contained in MISR 18 is shifted out during the next six clock cycles. The shifted data may be applied directly to the tester 19 or via the controller to the tester.

The tester is programmed to compare the data (SDO) shifted out of the MISR 18 with a preset number stored in the tester to determine whether the data read out of the MISR 18 is correct.

The invention has been illustrated with the counter 10 partitioned into two equal sections. However, it is evident that the counter could be divided into more than two sections and that the several sections need not have the same number of counting stages.

The invention has been illustrated with the use of MISR 18 to accumulate and compact the data. However, it should be appreciated that comparator circuitry could be used instead and/or that other types of summing circuitry could be used. It should also be evident that testing sequences used to illustrate the invention may be altered.

The invention has been illustrated with down counters set and/or reset to a given count which then count down to zero. It should be understood that the invention is equally applicable to up-counters, settable and/or resettable to any desired count and resettable to any desired count.

It should be appreciated that in systems embodying the invention the counter can be fully tested via five dedicated pins at the periphery of the IC2. The five pins would be needed for the following signals: TST, TCM, SHF, SDO and fin. Where fin is generated internally to the IC only four pins would be required. Theoretically, TCM and SDO could be multiplexed further reducing the number of pins. Thus, as shown in the FIGUREs, with the built in circuitry formed on the IC, very few pins are needed to test the counter very extensively.

What is claimed iS

1. A circuit formed on an integrated circuit (IC) comprising:

a counter having N counting stages, each counting stage having an input and an output, where N is an integer greater than 4;

means for partitioning said counter into X sections, where X is an integer equal to, or greater than 2;

means for applying clocking signals to the counting stages of said X sections;

means for, during a test period, selectively testing, one at a time, all of said X sections, in sequence, including means for selectively coupling to a register means the outputs of all the stages in one section and then coupling the outputs of all the stages in a succeeding section, until all the stages in all the sections have been coupled in turn to said register means for enabling said register means to count the outputs of the stages of all the X sections.

2. In a circuit as claimed in claim 1, wherein said register means is a multi-input shift register configured to compact the data received from each counting stage by said register means.

3. In a circuit as claimed in claim 1, wherein said means for partitioning said binary counter into X sections includes a gating means coupled between the output of a section and the input of the next section for normally coupling the two sections, said gating means for decoupling the two sections and enabling the application of a predetermined signal condition to the input of each section during said test period.

4. In a circuit as claimed in claim 1, wherein all the counter stage are operated synchronously.

5. In a circuit as claimed in claim 1, wherein said means for applying clocking signals to the counting stages of said X sections includes means for applying a predetermined input signal to the input stage of each one of said X sections for a certain number of clock cycles whereby each one of said X sections, when operating correctly, counts a predetermined number of clock cycles.

6. In a circuit as claimed in claim 1, wherein said means for partitioning and testing include a controller section for, during said test period, applying a reset signal to said counter and including means for receiving a first signal indicating the response of the counter to the reset signal.

7. In a circuit as claimed in claim 1, wherein said means for partitioning and testing include a controller section for, during said test period, supplying first and second signal conditions to said counter and including means for detecting the response of the counter to said first and second signal conditions, said means for detecting the response of the counter to said first and second signal conditions supplying to the controller signals indicative of the response and operability of the counter.

8. In a circuit as claimed in claim 1, wherein said means for selectively testing includes:

a) means for applying clocking signals to a first one and to a second one of said X sections;

b) means for detecting when a predetermined number of clocking cycles are applied to said first one of said X sections; and c) means for coupling the outputs of all the stages of a second one of said X sections to said register means during the time interval said predetermined number of clock cycles are applied to said first one of said X sections.

9. In a circuit as claimed in claim 1, wherein said means for selectively testing said X sections includes means for:

a) applying a first preset number of clocking cycles to a first one of said X sections and for detecting when said first one of said X sections has counted said first preset number, the time to count said first preset number defining a first time interval, and for, during said first time interval, applying clocking signals to a second one of said X sections and coupling the outputs of all the counting stages in said second one of said X sections to said register means during said first time interval; and b) applying a second preset number of clocking cycles to said second one of said X sections and for detecting when said second one of said X sections has counted said second preset number, the time to count said second preset number defining a second time interval, and for, during said second time interval, applying clocking signals to said first one of said X sections and coupling the outputs of all the counting stages in said first one of said X sections to said register during said second time interval.

10. In a circuit as claimed in claim 1, wherein X is equal to two with the counter being partitioned into two equal sections, each section having N/2 counting stages and the first section being coupled to the second section via a selectively enabled gate.

11. A circuit comprising:

a long counter having N counting stages, each stage having an input and an output, where N is an integer greater than 4;

means for partitioning said long counter into X sections, each section including a number of said N counting stages interconnected to form a shorter counter than said long counter; each section having an input defined by the input of the first counting stage of that section, and each section having an output defined by the output of the last counting stage of that section; where X is an integer equal to, or greater than 2; said means for partitioning said long counter including a gating means connected between the last stage of a first one of said X sections and the input stage of a second one of said X sections;

means for applying a control signal to said gating means for normally enabling the gating means to couple the output of said first section to the input of said second section and for, during a test period, decoupling said first and second sections and enabling a predetermined condition to be applied to the inputs of said first and second sections; and means for, during said test period, selectively and sequentially testing all of said X sections including means for selectively coupling, one at a time, the outputs of each and every stage in a section being tested to a register stage for counting in sequence the outputs of the stages of all the X sections.

12. A circuit as claimed in claim 11, wherein said means for partitioning said long counter includes means for partitioning said N counting stages into X sections, each section having N/X counting stages, and wherein said means for selectively and sequentially testing all of said X sections includes a multiplexer having N inputs and N/X outputs, each one of said N inputs of said multiplexer being coupled to a different one of the N outputs of said counting stages; and said multiplexer being responsive to a multiplexer control signal for sequentially passing all the N/X outputs of the stages of each section, at a time, to said register stage.

13. A circuit as claimed in claim 12 wherein said means for sequentially and selectively testing all of said X sections includes a controller section for controlling the partitioning of the N counting stages and the sequence of the transfer of the data from the counting stages via the multiplexer to the register stage.

14. A circuit as claimed in claim 13 wherein said register stage is a multi-input shift register configured to enable the data inputted to the shift register to be compacted.

15. A circuit as claimed in claim 14 wherein said circuit is formed on an integrated circuit (IC).

16. A circuit as claimed in claim 11 wherein said counting stages are interconnected to form a synchronous counter.

17. A method of testing the operability of an N stage counter, where N is an integer greater than 4 and each stage has an input and an output, comprising the steps of:

setting the N stages of the counter to a first condition and detecting the presence of the first condition;

setting the N stages of the counter to a second condition, different than said first condition, and detecting the presence of the second condition;

partitioning the N stages of the counter into X counter sections, where X is equal to or greater than 2 and less than N; and during a first time interval:
(a) applying clocking signals to a first one of said X sections and detecting when said first one of said X sections has counted a predetermined number of clock cycles; and (b)
(b) applying clocking signals to a second one of said X sections and summing the counts produced at the outputs of all the stages of said second section.

18. The method of claim 17 further providing during a second time interval the steps of:

(a) applying clocking signals to said second one of said X sections and detecting when said second one of said X sections has counted a given number of clock cycles; and
(b) applying clocking signals to said first one of said X sections and summing the counts produced at the outputs of all the stages of said first section.

19. A method as claimed in claim 18, further including the steps of:

summing and accumulating the counts produced during the first and second time intervals and storing them in a register;

detecting the end of the first and second time intervals and generating a test complete signal;

generating a signal applied to the register for reading out the accumulated counts stored in the register; and comparing the information read out of the register with known data indicative of accurate operation.

20. The combination comprising, a plurality of counter stages, each counter stage having an input and an output;

X of said counter stages being interconnected to form a first counter section having a first counter input and a first counter output;

Y of said counter stages being interconnected to form a second counter section having a second counter input and a second counter output; where X and Y are integers greater than 2;

gating means for selectively coupling the first counter output of the first counter section to the second counter input of the second counter section and for, during a testing phase, selectively decoupling the first counter output from the second counter input and for then supplying the same value signal to the first and second counter inputs of the first and second counter sections;

testing means for, during said testing phase, applying clocking signals to said first and second counter sections, said first section for controlling the number of clocking cycles applied to said second counter section during a first time interval; and register means coupled to the outputs of all the stages of said second counter section for totalling all the counts of said second section during said first time interval.

21. The combination as claimed in claim 20 wherein said testing means includes means for, during a second time interval, setting said second section to a condition for controlling the number of clocking cycles applied to said first counter section; and for coupling to said register means the outputs of all the stages of said first counter section for totalling all the counts of said first section during said second time interval.

22. A circuit formed on an integrated circuit (IC) comprising:

a counter having N interconnected counting stages, each counting stage having an input and an output, where N is an integer greater than 4;

means for testing the operability of the counting stages, including:
(a) means for partitioning said counter into X sections, each section having N/X stages, where X is an integer equal to, or greater than 2;
(b) means for applying clocking signals to, at least, first and second ones of said X sections;
(c) means for detecting when a predetermined number of clock cycles have been applied to a first one of said X sections and thereby defining a first time interval;
(d) means for, during said first time interval, sensing the outputs of each stage of a second one of said X sections for totalling the outputs produced by said second one of said X sections; and
(e) means for selectively resetting the N counting stages to a certain condition and for detecting the response of the N counting stages to the resetting condition.

23. The circuit as claimed in claim 22 wherein said means for testing the operability of the counting stages also includes means for selectively setting the N counting stages to a given condition and for detecting the response of the N counting stages to the setting condition.

* * * * *